US008340939B2

(12) United States Patent
Shi et al.

(10) Patent No.: US 8,340,939 B2
(45) Date of Patent: Dec. 25, 2012

(54) METHOD AND APPARATUS FOR SELECTING PATHS FOR USE IN AT-SPEED TESTING

(75) Inventors: Yiyu Shi, Los Angeles, CA (US); Chandramouli Visweswariah, Croton-on-Hudson, NY (US); Jinjun Xiong, White Plains, NY (US); Vladimir Zolotov, Putnam Valley, NY (US)

(73) Assignee: International Business Machines Corporation, Armonk, NC (US)

( * ) Notice: Subject to any disclaimer, the term of this patent is extended or adjusted under 35 U.S.C. 154(b) by 483 days.

(21) Appl. No.: 12/610,090

(22) Filed: Oct. 30, 2009

(65) Prior Publication Data

US 2011/0106483 A1 May 5, 2011

(51) Int. Cl.
*G01R 31/00* (2006.01)
(52) U.S. Cl. ........................................................ 702/120
(58) Field of Classification Search .................... 702/120
See application file for complete search history.

(56) References Cited

U.S. PATENT DOCUMENTS

| 7,116,142 | B2 | 10/2006 | Ferraiolo et al. | |
|---|---|---|---|---|
| 7,257,800 | B1 | 8/2007 | Singh et al. | |
| 7,478,356 | B1 | 1/2009 | Sundararajan et al. | |
| 7,620,921 | B2 | 11/2009 | Foreman et al. | |
| 7,647,573 | B2 | 1/2010 | Abadir et al. | |
| 7,886,247 | B2 | 2/2011 | Fatemi et al. | |
| 7,971,169 | B1 | 6/2011 | Tetelbaum et al. | |
| 8,176,462 | B2* | 5/2012 | Visweswariah et al. | 716/136 |
| 2003/0188246 | A1 | 10/2003 | Rearick et al. | |
| 2005/0065765 | A1 | 3/2005 | Visweswariah | |
| 2007/0074135 | A1* | 3/2007 | Craig et al. | 716/5 |
| 2007/0288822 | A1 | 12/2007 | Lin et al. | |
| 2008/0183731 | A1 | 7/2008 | Gilbert | |
| 2008/0209292 | A1 | 8/2008 | Yokota | |
| 2008/0270953 | A1* | 10/2008 | Foreman et al. | 716/4 |
| 2009/0037854 | A1* | 2/2009 | Bittlestone et al. | 716/4 |
| 2009/0100393 | A1* | 4/2009 | Visweswariah et al. | 716/6 |
| 2009/0112344 | A1 | 4/2009 | Nackaerts et al. | |
| 2009/0115469 | A1 | 5/2009 | Cortadella et al. | |
| 2009/0119629 | A1* | 5/2009 | Grise et al. | 716/6 |
| 2009/0132976 | A1* | 5/2009 | Desineni et al. | 716/5 |
| 2009/0271751 | A1* | 10/2009 | Fatemi et al. | 716/6 |
| 2010/0162064 | A1* | 6/2010 | Shi et al. | 714/738 |

OTHER PUBLICATIONS

Jess et al.; "Statistical Timing for Parametric Yield Prediction of Digital Integrated Circuits"; DAC 2003, Jun. 2-6, 2003, Anaheim, California, USA, Copyright 2003 ACM 1-58113-688 9/03/001 pp. 932-937 alternately known as IEEE; vol. 25, No. 11; Nov. 2006; pp. 2376-2392.

"Variation-Aware Performance Verification Using At-Speed Structural Test and Statistical Timing", by Vikram Iyengar, Jinjun Xiang, Subbayyan Venkatesan, and Vladimir Zololov, pp. 405-412, @2007 by IEEE.

* cited by examiner

*Primary Examiner* — Cindy H Khuu
(74) *Attorney, Agent, or Firm* — Preston J. Young

(57) ABSTRACT

In one embodiment, the invention is a method and apparatus for selecting paths for use in at-speed testing. One embodiment of a method for selecting a set of n paths with which to test an integrated circuit chip includes: organizing the set of n paths into a plurality of sub-sets, receiving a new candidate path, and adding the new candidate path to one of the sub-sets when the new candidate path improves the process coverage metric of the sub-sets.

22 Claims, 5 Drawing Sheets

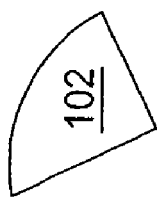
POST-ATPG
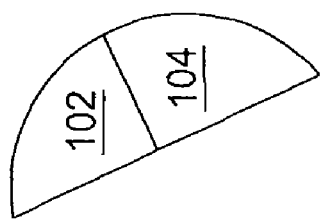
POST-ATPG
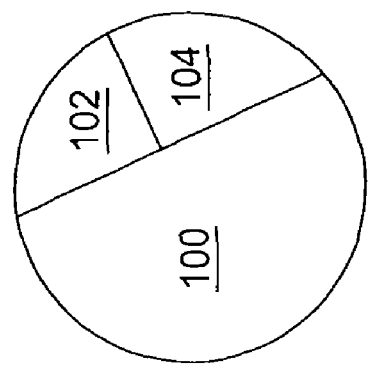
PRE-ATPG
FIG. 1

METHOD AND APPARATUS FOR SELECTING PATHS FOR USE IN AT-SPEED TESTING

BACKGROUND OF THE INVENTION

The present invention relates generally to design automation, and relates more particularly to path selection techniques for at-speed structural test (ASST) of integrated circuit (IC) chips.

When IC chips come off the manufacturing line, the chips are tested "at-speed" to ensure that they perform correctly (and to filter out chips that do not perform correctly). In particular, a set of paths is selected, and the set of paths is then tested for each chip in order to identify the chips in which one or more of the selected paths fail timing requirements. Selection of these paths is complicated by the presence of process variations. Because of these variations, different paths can be critical in different chips. That is, a path that is critical in one chip may not be critical in another chip, and vice versa. As such, selection of the paths that have a higher probability of being critical is typically a goal.

Selected paths are provided to an automatic test pattern generation (ATPG) tool for generation of test patterns. After ATPG, some of the paths may be un-sensitizable; only those paths that are sensitizable with test patterns are actually used to test the chips. Thus, although the pre-ATPG path selection may have found a set of paths that covers the process space reasonably well, the subset of these paths that is actually sensitizable may not cover the process space as well.

FIG. 1 is a diagram comparing the coverage of a pre-ATPG set of paths and a post-ATPG subset of these paths. Pre-ATPG, three paths have been selected: a first path covering corresponding process space 100, a second path covering corresponding process space 102, and a third path covering corresponding process space 104. However, if after ATPG the first path 100 turns out to be un-sensitizable, then only the process space covered by the second and third paths 102 and 104 will be covered by testing. Alternatively, if both the first and third paths 100 and 104 are determined to be un-sensitizable after ATPG, then only the process space covered by the second path 102 will be covered by testing. In other words, the post-ATPG process space coverage is greatly reduced compared to the pre-ATPG process space coverage. Although FIG. 1 illustrates only the "single-layer coverage" case, the results for path selection guided by "multi-layer coverage" are similar.

SUMMARY OF THE INVENTION

In one embodiment, the invention is a method and apparatus for selecting paths for use in at-speed testing. One embodiment of a method for selecting a set of n paths with which to test an integrated circuit chip includes: organizing the set of n paths into a plurality of sub-sets, receiving a new candidate path, and adding the new candidate path to one of the sub-sets when the new candidate path improves the process coverage metric of the sub-sets.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a diagram comparing the coverage of a pre-automatic test pattern generation set of paths and a post-automatic test pattern generation subset of these paths;

DETAILED DESCRIPTION

Figure 2:
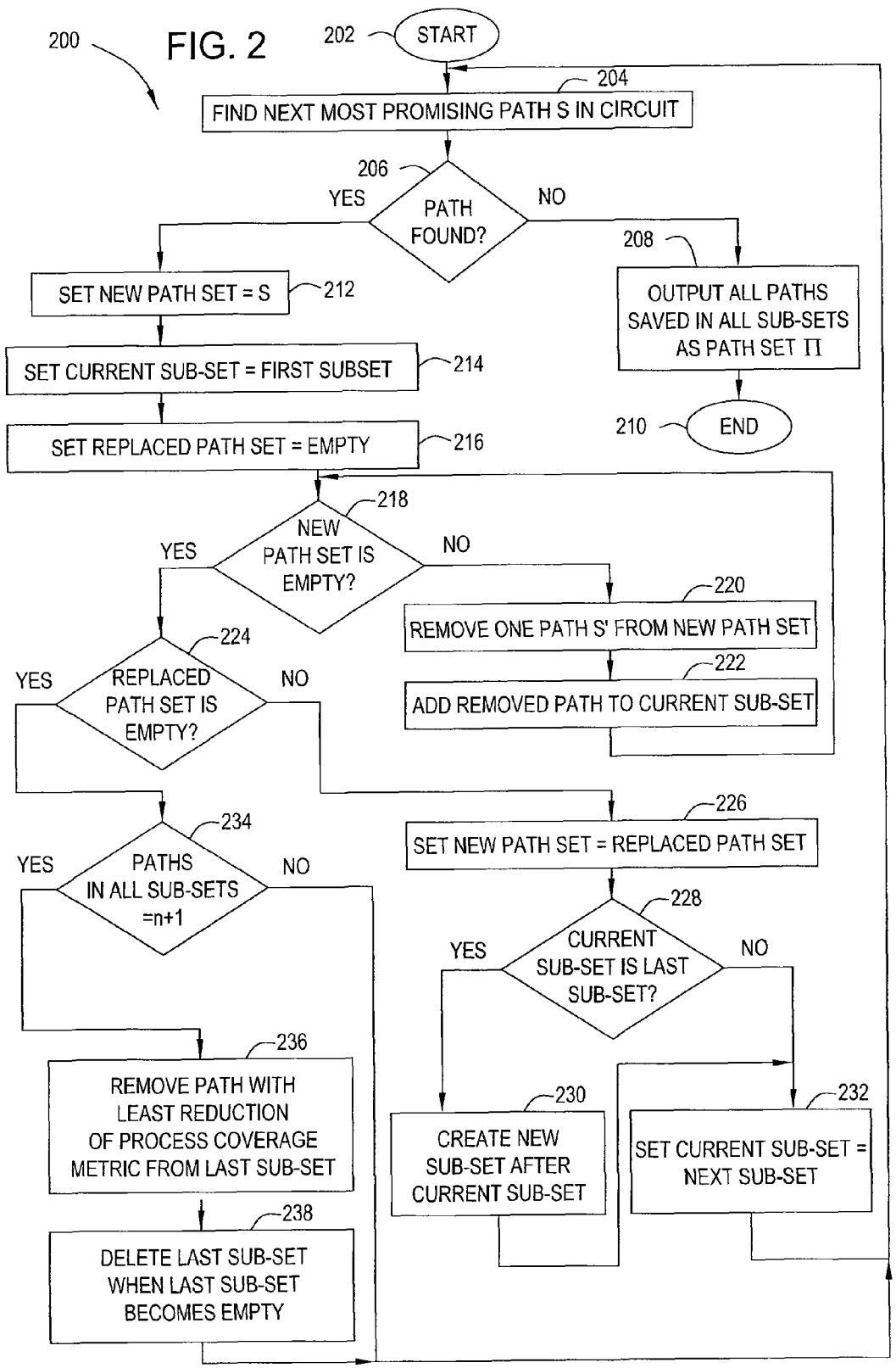
FIG. 2 is a flow diagram illustrating one embodiment of a method for selecting a set of paths for use in at-speed testing.

In one embodiment, the present invention is a method and apparatus for selecting paths for use in at-speed testing of IC chips. Embodiments of the invention select a set of n paths, pre-ATPG, to maximize post-ATPG process space coverage. In addition, the run-time efficiency of the present invention is improved with respect to conventional path selection techniques.

As discussed above, selection of a set of paths for ASST is complicated by the presence of process variations. The variation of each process parameter is modeled as a random variable $\Delta X_k$. For K number of process parameters, the corresponding random variables jointly form a K-dimensional space $\Omega = R^K$. The impact of process variation on timing is modeled by denoting the path slack S of a path as a function of these process parameters. In other words, $S=F(\Delta X_k)$. Depending on each chip's manufacturing conditions (i.e., the particular setting of each process parameter), the same path will exhibit different slacks on different chips.

A direct mapping from a path slack S to its process space coverage is defined as:

$$\omega = \{\Delta X_k | S = F(\Delta X_k) \leq 0\} \subset \Omega \qquad \text{(EQN. 1)}$$

In other words, $\omega$ is the subspace of those process parameters where the path slack S is negative. Within the context of the present invention, this implies that the subspace is "covered" by testing the corresponding path.

For a set of n paths having path slacks denoted as $\Pi = \{S_1, S_2, \ldots, S_n\}$, the corresponding process space coverage is the union of each of individual path's corresponding process space coverage, or:

$$\omega(\Pi) = \omega_1 \cup \omega_2 \ldots \cup \omega_n \qquad \text{(EQN. 2)}$$

which is equivalent to saying that under process conditions of any point in $\omega(\Pi)$, at least one path from the set of n paths will have negative path slack S. Thus:

$$\omega(\Pi) = \{\Delta X_k \mid S_1 \leq 0, \text{ or } S_2 \leq 0, \ldots, \text{ or } S_n \leq 0\} \qquad \text{(EQN. 3)}$$
$$= \{\Delta X_k \mid \min(S_1, S_2, \ldots, S_n) \leq 0\}$$

Because the entire K-dimensional space $\Omega$ is spanned by the K number of random variables $\Delta X_k$, a metric can be assigned to this space through a Lebesgue measure, i.e., the probability-weighted area of the process space, as follows:

$$q(\Pi) = |\omega(\Pi)| = P(\min(S_1, S_2, \ldots, S_n) \leq 0) \qquad \text{(EQN. 4)}$$

Such a metric $q(\Pi)$ is referred to herein as a "single-layer process space coverage metric," because it only measures the space that has been covered at least once by the set of n paths. To measure the space $\tilde{\omega}^{(m)}(\Pi)$ that has been covered at least m times by the set of n paths, an "m-layer process space coverage metric" is defined as $$q^{(m)}(\Pi)=|\omega^{(m)}(\Pi)|=P(f_{n,m}(S_1, S_2, \ldots, S_n) \leq 0) \quad \text{(EQN. 5)}$$

where $f_{n,m}(S_1, S_2, \ldots, S_n)$ is the $m^{th}$ order statistic of the input n slacks. Thus, EQN. 4 is a special case of EQN. 5 in which $m=1$. Therefore, the term "process coverage metric" is used herein to denote both the single-layer and the multi-layer case.

Given a set of paths $\Pi$ for testing, the single-layer "test quality metric" $Q(\Pi)$ is defined as the probability of a chip having positive slack conditional upon the tested paths also having positive slack, or:

$$Q(\Pi)=P(S_c \geq 0 | \min(S_1, S_2, \ldots, S_n) \geq 0) \quad \text{(EQN. 6)}$$

where $S_c$ is the minimum slack of the entire chip ("chip slack"). The test quality metric is related to the process coverage metric through:

$$Q(\Pi) = \frac{P(S_c \geq 0)}{1 - q(\Pi)} \quad \text{(EQN. 7)}$$

where $P(S_c \geq 0)$ is a constant for a given chip design. When the m-layer process coverage metric is used, the corresponding test quality metric becomes an m-layer test quality metric.

From the above, it is clear that the larger the test quality metric, the better the test quality of the set of n paths. Moreover, knowing one of the test quality metric and the process coverage metric can help to obtain the other (based on the relationship as defined in EQN. 7), and maximizing the test quality metric is equivalent to maximizing the process coverage metric (whether the coverage is single-layer or multi-layer). Therefore, the process coverage metric is referred to herein in describing embodiments of the present invention.

When slacks are represented as a functional form of the underlying process parameters $\Delta X_k$, the process coverage metric can be computed in linear time $O(mn)$ and space $O(n)$ with the number of layers m typically being smaller than the number n of paths.

Given a chip design with v total number of paths, each path can be either sensitizable or un-sensitizable. One realization of all path ATPG outcomes is defined as the full knowledge of every path's sensitizability. For a chip design with v total number of paths, the number of possible realizations is $2^v$. For example, assume a chip design with a total number of paths $v=5$, denoted as $\{A, B, C, D, E\}$. The subscript $\mathbf{0}$ denotes that a particular path is un-sensitizable, while the subscript $\mathbf{1}$ denotes that the path is sensitizable. So if all of the paths are sensitizable, the set of paths would be denoted as $A_1 B_1 C_1 D_1 E_1$; whereas if all of the paths are un-sensitizable, the set of paths would be denoted as $A_0 B_0 C_0 D_0 E_0$. So the total number of possible realizations of all path ATPG outcomes is $2^5=32$.

For a given chip design, one and only one of the $2^v$ realizations is the true realization that is determined by the design logic. However, it is difficult to tell which of the realizations is the true realization, since it is practically infeasible to run ATPG on all v paths for a million-gate design where v could easily be on the order of billions.

Embodiments of the invention distinguish cases in which there are multiple choices of different sets of paths that all achieve the same process coverage metric. The reason for this ambiguity is the existence of redundant paths in the path set. Within the context of the present invention, a redundant path is a path whose removal from the original set of paths does not change the process coverage metric. In other words, the process coverage metric for the original set of paths is unchanged by the inclusion of a redundant path. If one were only interested in finding the best pre-ATPG process coverage metric and insisted on finding the minimum number of paths, then redundancy issues are of little concern. However, in practice, a fixed number of paths is typically required. Requiring a fixed number of paths protects against loss of coverage quality due to post-ATPG un-sensitizability issues and builds redundancy into the testing for robustness.

FIG. 2 is a flow diagram illustrating one embodiment of a method 200 for selecting a set $\Pi$ of paths for use in at-speed testing. The method 200 organizes a given plurality of available paths into a plurality of "buckets" or sub-sets. Each sub-set contains an irreducible set of paths with its own process coverage metric. Within the context of the present invention, "irreducible" means that all paths in the sub-set must be in the sub-set in order to achieve the process coverage metric; if any of the paths is removed from the sub-set, the process coverage metric will be reduced. In one embodiment, the sub-sets are ordered according to their individual process coverage metrics (e.g., from high to low). Thus, any sub-set will be fully contained within a sub-set having a larger process coverage metric.

The method 200 is initialized in step 202 and proceeds to step 204, where the method 200 finds a next most promising path S in the circuit under consideration. In one embodiment, this next most promising path is obtained using a branch and bound technique, for example as discussed by Fatemi et al. in U.S. patent application Ser. No. 12/111/634, which is herein incorporated by reference in its entirety. This branch and bound technique continuously searches the next most promising path S and terminates when it has exhausted all promising paths. As discussed in further detail below, the method 200 greedily selects paths that improve the process coverage metric the most.

In step 206, the method 200 determines whether a next most promising path S has been found. If the method 200 concludes in step 206 that a next most promising path has not been found, the method 200 proceeds to step 208 and outputs all paths saved in all sub-sets as the path set $\Pi$ before terminating in step 210.

Alternatively, if the method 200 concludes in step 206 that a next most promising path has been found, the method 200 proceeds to step 212 and sets the new path set equal to the next most promising path S. The method 200 then sets a current sub-set equal to the first sub-set in step 214. Next, the method 200 sets a replaced path set equal to an empty set.

Having set the new path set, the current sub-set, and the replaced path set, the method 200 proceeds to step 218 and determines whether the new path set is empty. If the method 200 concludes in step 218 that the new path set is not empty, the method 200 proceeds to step 220 and removes one path S' from the new path set. The method 200 then adds the removed path S' to the current sub-set. One embodiment of a method for adding the removed path S' to the current sub-set is discussed in greater detail with respect to FIG. 3. Having added the removed path S' to the current sub-set, the method 200 returns to step 218 and proceeds as described above.

Alternatively, if the method 200 concludes in step 218 that the new path set is empty, the method 200 proceeds to step 224 and determines whether the replaced path set is empty. If the method 200 concludes in step 224 that the replaced path set is not empty, the method 200 proceeds to step 226 and sets the new path set equal to the replaced path set. The method 200 then proceeds to step 228 and determines whether the current sub-set is the last sub-set.

If the method 200 concludes in step 228 that the current sub-set is the last sub-set, the method 200 proceeds to step 230 and creates a new sub-set after the current sub-set. The new sub-set is "below" the current sub-set (and possibly below all or most of the other sub-sets) in that the new sub-set has a lower process coverage metric than the current sub-set. The method 200 then sets the current sub-set equal to the next sub-set (i.e., the new sub-set if step 230 has been performed) in step 232 before returning to step 204 and proceeding as described above.

Alternatively, if the method 200 concludes in step 228 that the current sub-set is not last sub-set, the method 200 skips step 230 and proceeds directly to step 232 without creating a new sub-set.

Referring back to step 224, if the method 200 concludes in step 224 that the replaced path set is empty, the method 200 proceeds to step 234 and determines whether the number of paths in all of the sub-sets is equal to n+1, where n is the path budget (e.g., total number of paths to be output by the method 200). As discussed above, in some embodiments, there may be a budget or limit on the number of paths that can be provided to the ATPG tool. If the method 200 concludes in step 234 that the number of paths in all of the sub-sets is not equal to n+1, the method 200 returns to step 204 and proceeds as described above.

Alternatively, if the method 200 concludes in step 234 that the number of paths in all of the sub-sets is equal to n+1, the method 200 proceeds to step 236 and removes from the last sub-set the path that results in the least reduction in process coverage metric to the last sub-set. In step 238, the method 200 deletes the last sub-set when the last sub-set becomes empty, before returning to step 204 and proceeding as described above.

Figure 3:
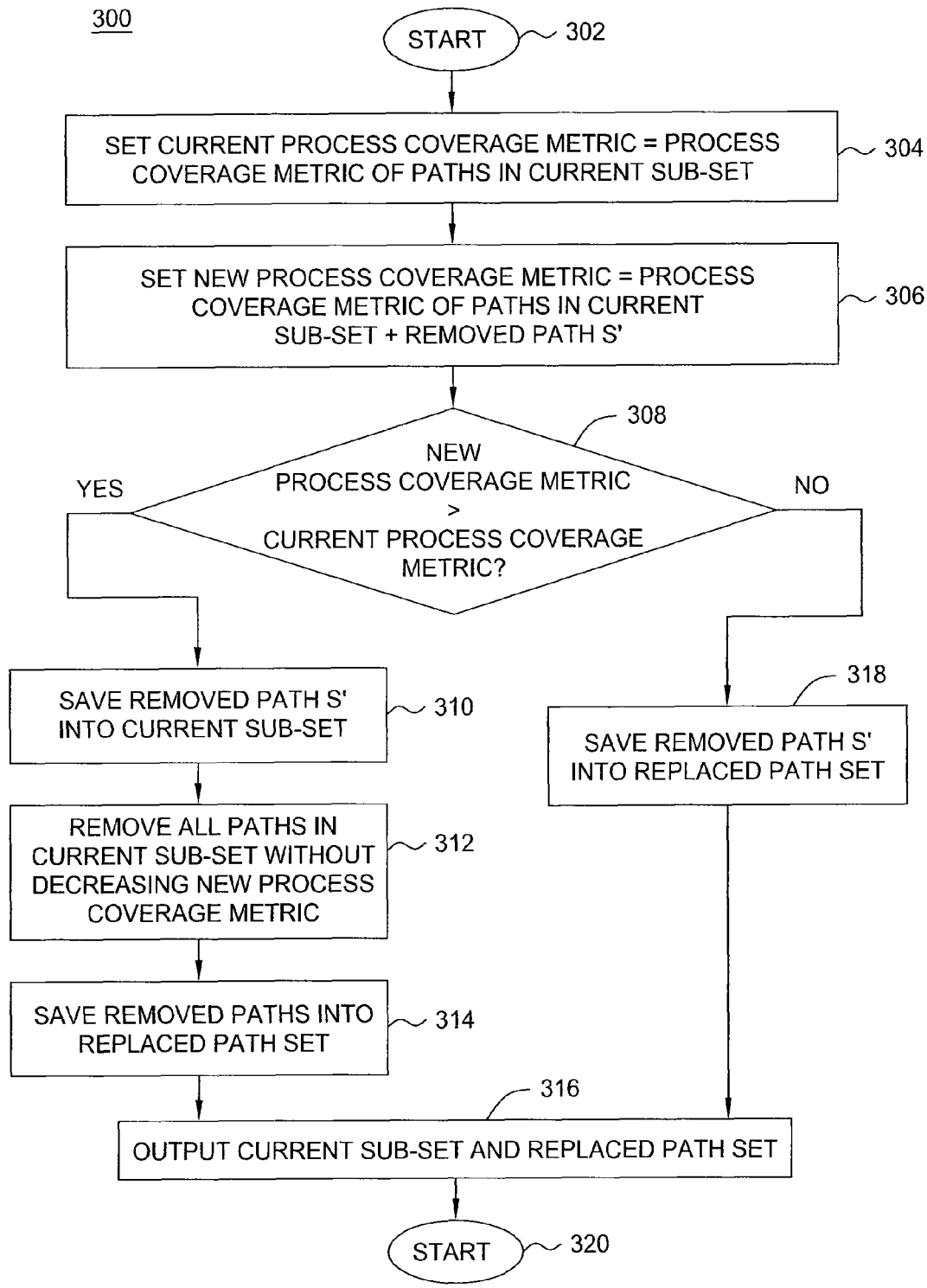
FIG. 3 is a flow diagram illustrating one embodiment of a method for adding a path removed from a new path set to a current sub-set, according to the present invention.

FIG. 3 is a flow diagram illustrating one embodiment of a method 300 for adding a removed path to a current sub-set, according to the present invention. The method 300 may be implemented, for example, in accordance with step 222 of the method 200, as described above.

The method 300 is initialized in step 302 and proceeds to step 304, where the method 300 sets a current process coverage metric to the process coverage metric of the paths in the current sub-set. In step 306, the method 300 sets a new process coverage metric equal to the process coverage metric of the paths in the current sub-set plus the removed path S'. The method 300 then proceeds to step 308 and determines whether the new process coverage metric is greater than the current process coverage metric (e.g., whether addition of the removed path S' to the current sub-set improves the process coverage metric of the current sub-set).

If the method 300 concludes in step 308 that the new process coverage metric is greater than the current process coverage metric, the method 300 proceeds to step 310 and saves the removed path S' into the current sub-set.

In step 312, the method 300 removes from the current sub-set all paths that can be removed without decreasing the new process coverage metric. In other words, the method 300 removes from the current sub-set any paths that are redundant (i.e., would make the set of paths in the current sub-set reducible).

In step 314, the method 300 saves that paths that were removed from the current sub-set into the replaced path set. The method 300 then outputs the current sub-set and the replaced path set before terminating in step 320.

Referring back to step 308, if the method 300 concludes in step 308 that the new process coverage metric is not greater than the current process coverage metric, the method 300 proceeds to step 318 and saves the removed path S' into the replaced path set. The method 300 then proceeds to step 316 and outputs the current sub-set and the replaced path set before terminating, as described above.

Thus, in short, instead of putting all n paths into a single set the method 200 breaks the n paths into different sub-sets, and the process coverage metric is evaluated for each sub-set individually. When a new candidate path is found, the sub-sets are evaluated in order from highest process coverage metric to lowest process coverage metric to determine if the new path can improve the process coverage metric in any of the sub-sets. If the new path improves the process coverage metric of a sub-set, it is added to that subset; at the same time, the new path may eject one or more previous paths from that subset. Rather than discard the ejected paths, the ejected paths are also evaluated against "lower" sub-sets to determine if they can improve the process coverage metric of any of those sub-sets. During this process, sub-sets may be dynamically added and deleted from the plurality of sub-sets. However, if there is a path budget, the method 200 ensures that no more than the n required paths are maintained cumulatively among the plurality of sub-sets.

Figure 4:
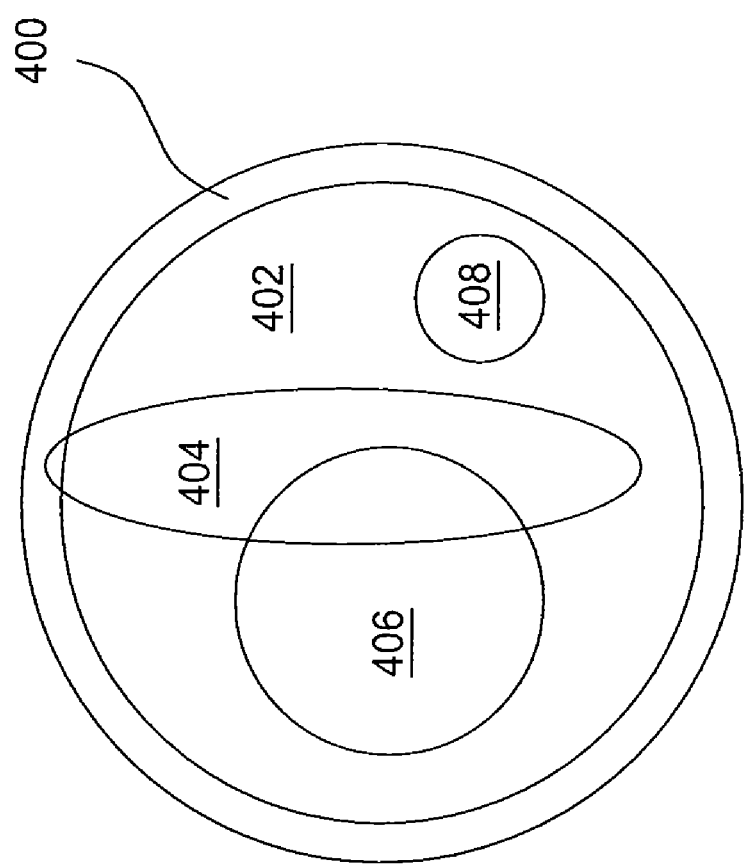
FIG. 4 is a diagram illustrating how the method illustrated in FIG. 2 works.

The output of the method 200 is thus n paths organized in T ordered sub-sets, with each sub-set containing $n_i$ paths such that $\Sigma_{i=1}^{T} n_i = n$. For example, FIG. 4 is a diagram illustrating how the method 200 works. For simplicity, FIG. 4 illustrates the use of a single-layer process coverage metric to guide path selection. As illustrated, there are a total of v=5 paths in the chip design: a first path 400, a second path 402, a third path 404, a fourth path 406, and a fifth path 408. The process space coverage of each of these paths 400-408 is also illustrated.

Assuming that the paths 400-408 are explored in sequence as second path 402→first path 400→third path 404→fifth path 408→fourth path 406 during a branch and bound procedure, one can find a set of n=4 paths with the algorithm proceeding as illustrated in Table 1, below. Table 1 illustrates how sub-sets are dynamically maintained.

TABLE 1

Progress of the method 200 based on example of FIG. 4

| Path Sequence | Path set organized in sub-sets |
| --- | --- |
| 402 | $\Gamma_1 = \{402\}$ |
| →400 | $\Gamma_1 = \{400\}, \Gamma_2 = \{402\}$ |
| →404 | $\Gamma_1 = \{400\}, \Gamma_2 = \{402, 404\}$ |
| →408 | $\Gamma_1 = \{400\}, \Gamma_2 = \{402, 404\}, \Gamma_3 = \{408\}$ |
| →406 | $\Gamma_1 = \{400\}, \Gamma_2 = \{402, 404\}, \Gamma_3 = \{406\}$ |

In other words, when the method 200 terminates, the selected n=4 paths will be organized into T=3 subsets as $\Gamma_1 = \{400\}$, $\Gamma_2 = \{402, 404\}$, and $\Gamma_3 = \{406\}$.

The method 200 illustrated in FIG. 2 exhibits a number of useful properties. For instance, when a new candidate path S is found, if the current path set has less than n number of paths in it, the new candidate path S will always be added into the path set with the possibility of creating a new sub-set. If the current path set already has n paths, one and only one path (maybe the new candidate path S) that affects the last sub-set's process coverage metric the least will be discarded from the last sub-set, and the last sub-set may be removed if it becomes empty as a result.

In addition, if the output of the method 200 comprises T ordered sub-sets, the process coverage metric of each sub-set is also ordered as $q(\Gamma_1) \geqq q(\Gamma_2) \geqq \ldots q(\Gamma_T)$. Moreover, the process coverage metric of $t^{th}$ sub-set for all t<T is equal to the best achievable process coverage metric, had all paths in the first t−1 sub-sets not existed in the chip design. An equivalent way to interpret this property is through process space coverage. Among the T ordered sub-sets, the process space covered by a prior or larger sub-set is always a super set of the process space covered by a subsequent or smaller sub-set. That is, $\omega(\Gamma_1) \supset \omega(\Gamma_1) \supset \ldots \supset \omega(\Gamma_T)$. For the example shown in Table 1, one would have $\omega(400) \supset \omega(402,404) \supset \ldots \supset \omega(406)$, as shown in FIG. 4.

These properties substantially ensure that every candidate path S will be kept in the path set as long as the candidate path can improve one of the sub-set's process coverage metrics. Thus, a prior sub-set's process coverage metric is always greater than or equal to a subsequent sub-set's process coverage metric.

This leads to the following theorem regarding the optimality of the method 200: Given a chip design with a total of v paths, the method 200 selects a set of n paths in T ordered sub-sets. Then, among all possible $2^v$ realizations of the post-ATPG sensitization results, the selected set of n paths is optimal with the best post-ATPG process coverage metric when the intersection of the process space not covered by the first t<T sub-sets is empty.

Mathematically, this theorem can be explained as follows: Given one of the $2^v$ realizations of the post-ATPG sensitization results, one puts those sensitizable paths from each sub-set $\Gamma_i$ into $\Gamma_{i,1}$. The process space covered by this sub-set after ATPG is the space covered by $\Gamma_{i,1}$ and is denoted as $\omega(\Gamma_{i,1})$. Then, the space not covered by this sub-set is $\overline{\omega(\Gamma_{i,1})} = \Omega - \omega(\Gamma_{i,1})$. The intersection of process space not covered by the first t<T sub-sets is thus given by $\overline{\omega(\Gamma_{1,1})} \cap \overline{\omega(\Gamma_{2,1})} \cap \ldots \cap \overline{\omega(\Gamma_{t,1})}$. The theorem says that when this intersection space is empty, the selected set of n paths is optimal with the best post-ATPG process coverage metric.

A corollary to this theorem says that the selected set of n paths is optimal with the best post-ATPG process coverage metric if paths in one of the first t<T sub-sets are all sensitizable. Using the same example shown in Table 1, suppose there are n=4 paths organized in T=3 sub-sets as $\Gamma_1=\{400\}$, $\Gamma_2=\{402,404\}$, and $\Gamma_3=\{406\}$. Based on the corollary, one can claim that for the following realizations $400_1 402_* 404_* 406_* 408_*$ and $400_* 402_1 404_1 406_* 408_*$, where the subscript * denotes that the corresponding path can be either sensitizable or un-sensitizable, the selected four paths achieve the optimal post-ATPG process coverage metric. In other words, among $2^5=32$ possible realizations, the method 200 achieves the optimal post-ATPG process coverage metric in at least $2^4+2^3+2^2=20$ realizations, or among 20/32=62.5% possible realizations. By considering more complicated realization scenarios according to the theorem above, it is likely that the so-obtained paths would be optimal even for other possible realizations.

A second theorem states that, for the output of the method 200 with n paths in T ordered sub-sets, the optimal pre-ATPG m-layer process coverage metric can also be achieved for m=1 to m=T−1, and the process coverage metric corresponding to $m^{th}$ sub-set as defined by EQN. 4 is the same as the optimal m-layer process coverage metric defined in EQN. 5. In other words, to select n paths to achieve m-layer coverage, when m is smaller than T−1, the method 200 achieves an m-layer process coverage metric that cannot be improved further, no matter how many more paths are added. Alternatively, one can infer that it requires less then n paths in order to achieve the same m-layer process coverage metric.

In sum, the method 200 achieves post-ATPG optimality without having to actually run the ATPG tools. Many practical applications can immediately benefit from this result. For example, although the method 200 is described within the exemplary context of path selection for ASST, those skilled in the art will realize that it could be applied to similar advantage to improve the results of variation-aware critical path reporting, common path pessimism removal, chip binning, and yield optimization. Moreover, the method 200 can be more generally extended to any discrete multi-set cover problem. That is, the method 200 can be applied to determine an optimal set of elements, given a number of possible elements with which to work (i.e., where the optimal set of elements maximizes the output of a system in which the elements operate or are contained). For example, given a set of M possible locations to install surveillance cameras, where only a certain number of points of interest can be viewed from each of the possible locations and where only N number of surveillance cameras can be installed (M>N), the method 200 can be applied to maximize coverage of the points of interest (i.e., by determining the optimal set of N locations from among the M possible locations and also considering the fact that some of the surveillance cameras may fail to function properly after installation of these cameras at the chosen N locations).

Figure 5:
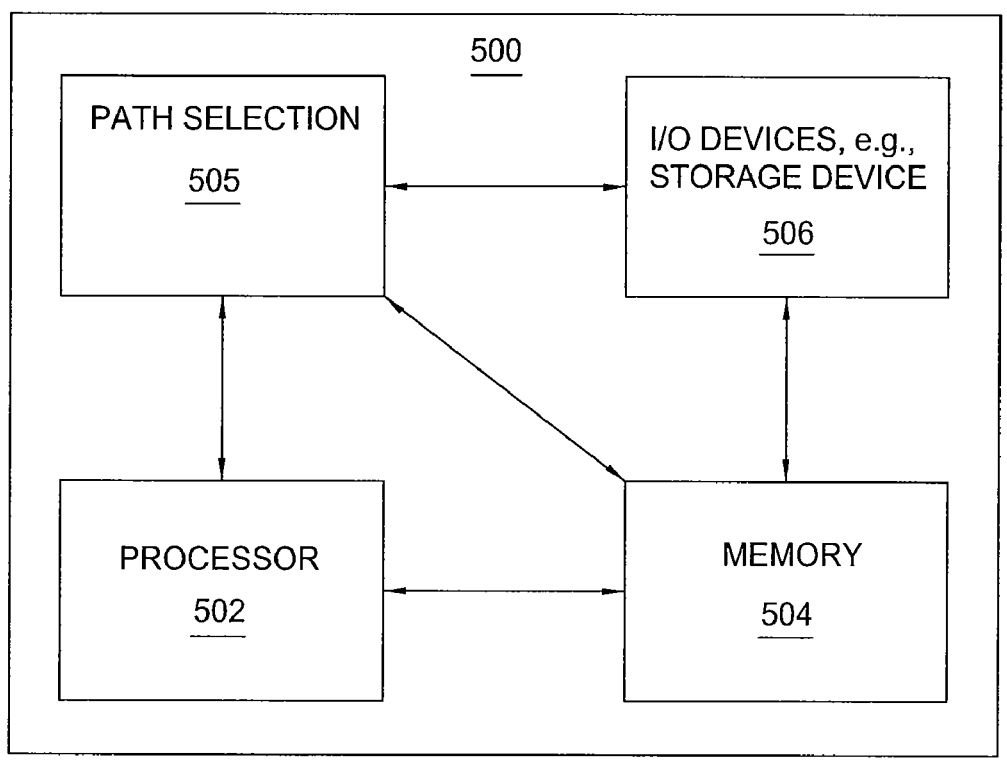
FIG. 5 is a high-level block diagram of path selection method that is implemented using a general purpose computing device.

FIG. 5 is a high-level block diagram of path selection method that is implemented using a general purpose computing device 500. In one embodiment, a general purpose computing device 500 comprises a processor 502, a memory 504, a path selection module 505 and various input/output (I/O) devices 506 such as a display, a keyboard, a mouse, a stylus, a wireless network access card, and the like. In one embodiment, at least one I/O device is a storage device (e.g., a disk drive, an optical disk drive, a floppy disk drive, a path selection tool, and/or a test pattern generation tool). It should be understood that the path selection module 505 can be implemented as a physical device or subsystem that is coupled to a processor through a communication channel.

Alternatively, the path selection module 505 can be represented by one or more software applications (or even a combination of software and hardware, e.g., using Application Specific Integrated Circuits (ASIC)), where the software is loaded from a storage medium (e.g., I/O devices 506) and operated by the processor 502 in the memory 504 of the general purpose computing device 500. Thus, in one embodiment, the path selection module 505 for selecting a set of paths for at-speed structural testing of an IC chip, as described herein with reference to the preceding Figures, can be stored on a computer readable storage medium (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for selecting a set of n paths with which to test an integrated circuit chip, the method comprising:
organizing the set of n paths into a plurality of sub-sets;
receiving a new candidate path;
adding the new candidate path to one of the plurality of sub-sets when the new candidate path improves a process coverage metric associated with the one of the plurality of sub-sets; and
creating a new sub-set for inclusion in the plurality of sub-sets when the new candidate path does not improve a process coverage metric associated with any of the plurality of sub-sets, where the new sub-set contains the new candidate path,
wherein at least one of the organizing, the receiving, and the adding is performed by a processor.

2. The method of claim 1, wherein the plurality of sub-sets are ordered in accordance with respective process coverage metrics, such that a first sub-set of the plurality of sub-sets has a highest one of the respective process coverage metrics and a last sub-set of the plurality of sub-sets has a lowest one of the respective process coverage metrics.

3. The method of claim 2, wherein the adding comprises:
evaluating the new candidate path against the plurality of sub-sets in order from the first sub-set to the last sub-set, until the one of the plurality of sub-sets is identified.

4. The method of claim 2, wherein a process space covered by a higher one of the plurality of sub-sets is a superset of a process space covered by any lower ones of the plurality of sub-sets.

5. The method of claim 2, further comprising:
identifying one or more reducible paths in the one of the plurality of sub-sets, after the adding; and
ejecting the one or more reducible paths from the one of the plurality of sub-sets.

6. The method of claim 5, further comprising:
adding the one or more reducible paths to another of the plurality of sub-sets when the one or more reducible paths improve a process coverage metric associated with the another of the plurality of sub-sets.

7. The method of claim 6, wherein the adding comprises:
evaluating the one or more reducible paths against the plurality of sub-sets in order from a sub-set following the one of the plurality of sub-sets to the last sub-set, until the another of the plurality of sub-sets is identified.

8. The method of claim 1, wherein each of the plurality of sub-sets contains an irreducible group comprising at least one of the n paths.

9. The method of claim 1, wherein each of the plurality of sub-sets is dynamically added to or deleted from the plurality of sub-sets.

10. A non-transitory computer readable storage medium containing computer instructions stored therein for causing a computer processor to select a set of n paths with which to test an integrated circuit chip, where the instructions specifically cause the computer processor to perform steps of:
organizing the set of n paths into a plurality of sub-sets;
receiving a new candidate path;
adding the new candidate path to one of the plurality of sub-sets when the new candidate path improves a process coverage metric associated with the one of the plurality of sub-sets; and
creating a new sub-set for inclusion in the plurality of sub-sets when the new candidate path does not improve a process coverage metric associated with any of the plurality of sub-sets, where the new sub-set contains the new candidate path.

11. The non-transitory computer readable storage medium of claim 10, wherein the plurality of sub-sets are ordered in accordance with respective process coverage metrics, such that a first sub-set of the plurality of sub-sets has a highest one of the respective process coverage metrics and a last sub-set of the plurality of sub-sets has a lowest one of the respective process coverage metrics.

12. The non-transitory computer readable storage medium of claim 11, wherein the adding comprises:
evaluating the new candidate path against the plurality of sub-sets in order from the first sub-set to the last sub-set, until the one of the plurality of sub-sets is identified.

13. The non-transitory computer readable storage medium of claim 11, wherein a process space covered by a higher one of the plurality of sub-sets is a superset of a process space covered by any lower ones of the plurality of sub-sets.

14. The non-transitory computer readable storage medium of claim 11, further comprising:
identifying one or more reducible paths in the one of the plurality of sub-sets, after the adding; and
ejecting the one or more reducible paths from the one of the plurality of sub-sets.

15. The non-transitory computer readable storage medium of claim 14, further comprising:
adding the one or more reducible paths to another of the plurality of sub-sets when the one or more reducible paths improve a process coverage metric associated with the another of the plurality of sub-sets.

16. The non-transitory computer readable storage medium of claim 15, wherein the adding comprises:
evaluating the one or more reducible paths against the plurality of sub-sets in order from a sub-set following the one of the plurality of sub-sets to the last sub-set, until the another of the plurality of sub-sets is identified.

17. The non-transitory computer readable storage medium of claim 11, wherein each of the plurality of sub-sets contains an irreducible group comprising at least one of the n paths.

18. The non-transitory computer readable storage medium of claim 11, wherein each of the plurality of sub-sets is dynamically added to or deleted from the plurality of sub-sets.

19. Apparatus for selecting a set of n paths with which to test an integrated circuit chip, the apparatus comprising:
means for organizing the set of n paths into a plurality of sub-sets;
means for receiving a new candidate path;
means for adding the new candidate path to one of the plurality of sub-sets when the new candidate path improves a process coverage metric associated with the one of the plurality of sub-sets; and
means for creating a new sub-set for inclusion in the plurality of sub-sets when the new candidate path does not improve a process coverage metric associated with any of the plurality of sub-sets, where the new sub-set contains the new candidate path.

20. A method, for selecting a set of n elements from among m possible elements, where m is greater than n, such that the output of a system containing the n elements is maximized, the method comprising:
organizing the set of n elements into a plurality of sub-sets;
receiving a new candidate element; and adding the new candidate element to one of the plurality of sub-sets when the new candidate element improves an output associated with the one of the plurality of sub-sets, wherein the plurality of sub-sets are ordered in accordance with respective outputs, such that a first sub-set of the plurality of sub-sets has a highest one of the respective outputs and a last sub-set of the plurality of sub-sets has a lowest one of the respective outputs, and wherein at least one of the organizing, the receiving, and the adding is performed by a processor.

21. The method of claim 20, wherein the adding comprises:
evaluating the new candidate element against the plurality of sub-sets in order from the first sub-set to the last sub-set, until the one of the plurality of sub-sets is identified.

22. The method of claim 20, further comprising:
identifying one or more reducible elements in the one of the plurality of sub-sets, after the adding;
ejecting the one or more reducible elements from the one of the plurality of sub-sets,
adding the one or more reducible elements to another of the plurality of sub-sets when the one or more reducible elements improve an output associated with the another of the plurality of sub-sets, wherein the adding comprises:
evaluating the one or more reducible elements against the plurality of sub-sets in order from a sub-set following the one of the plurality of sub-sets to the last sub-set, until the another of the plurality of sub-sets is identified.

\* \* \* \* \*